(12) United States Patent
Freeman et al.

(10) Patent No.: US 6,472,288 B2
(45) Date of Patent: Oct. 29, 2002

(54) METHOD OF FABRICATING BIPOLAR TRANSISTORS WITH INDEPENDENT IMPURITY PROFILE ON THE SAME CHIP

(75) Inventors: Gregory G. Freeman, Hopewell Junction, NY (US); K. T. Schonenberg, New Fairfield, CT (US); Kenneth J. Stein, Sandy Hook, CT (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/733,330

(22) Filed: Dec. 8, 2000

(65) Prior Publication Data

US 2002/0070410 A1 Jun. 13, 2002

(51) Int. Cl.[7] .............................................. H01L 21/331
(52) U.S. Cl. ...................... 438/369; 438/309; 438/341; 438/203; 438/933
(58) Field of Search ................................. 438/369, 309, 438/341, 203, 320, 318, 630, 933, 313, 314, 322–326, 31, 202, 204, 205

(56) References Cited

U.S. PATENT DOCUMENTS 5,930,635 A * 7/1999 Bashir et al. ................. 438/13

* cited by examiner

Primary Examiner—Matthew Smith
Assistant Examiner—Igwe W. Anya (57) ABSTRACT

Bipolar transistors of different designs, particularly designs optimized for different high frequency applications are formed on the same substrate by separate base layer formation processes for epitaxial growth including different material concentration profiles of germanium, boron and/or carbon. Epitaxial growth of individual growth layers by low temperature processes is facilitated by avoiding etching of the silicon substrate including respective collector regions through use of an etch stop that can be etched selectively to silicon. Annealing processes can be performed between growth of respective base layers and/or performed collectively after all transistors are substantially completed.

15 Claims, 10 Drawing Sheets

METHOD OF FABRICATING BIPOLAR TRANSISTORS WITH INDEPENDENT IMPURITY PROFILE ON THE SAME CHIP

DESCRIPTION

BACKGROUND OF THE INVENTION

1. Field of the Invention

The present invention generally relates to the formation of bipolar transistors in integrated circuits and, more particularly, to the formation of high-performance transistors having independently controllable properties developed by independently defined doping profiles on the same integrated circuit chip, possibly together with CMOS circuitry.

2. Description of the Prior Art

While CMOS (complementary metal-oxide-semiconductor) transistors have become the technology of choice in recent years for all but the most stringent performance requirements of integrated circuits, bipolar transistors provide some performance benefits not otherwise obtainable, particularly for high frequency signals, such as noise and low current gain. For this reason, techniques have been developed to form combinations of bipolar NPN and PNP transistors together with CMOS transistors on a single chip. This technology is generally referred to as BICMOS.

However, at the current state of the art, the trend in integrated circuits is toward placing an entire system on a single chip because increases in integration density have allowed increases in performance (by reducing interconnect length and propagation time, improving isolation and eliminating on-chip and off-chip drivers) as well as in functionality and manufacturing economy. While BICMOS technology has allowed entire systems to be integrated on a chip for some applications, other applications have required high performance transistors to be placed on a separate chip that may be laminated with or otherwise connected to another chip, such as that described above. While such a structure allows avoidance of some of the necessary interconnection length, it is not an optimum solution for highest frequency performance.

Further, at the present state of the art, various RF microwave and high-speed wired logic networks have differing requirements for bipolar transistors that may be required in different functional blocks of the system. For example, emitter coupled logic (ECL) circuits require a high value of Ft (the frequency at which current gain of the transistor becomes unity, typically 40–120 GHz for high performance designs) and Fmax (the maximum frequency at which the transistor can oscillate, typically 50–150 GHz for high performance designs) approximating the same value. Microwave blocks require a moderate Ft and Fmax=1.5–2.0 Ft. Additionally, parameters such as current gain, base resistance and collector capacitance must be optimized quite differently depending on the function required in different blocks of the system. For example, a microwave heterojunction bipolar transistor (HBT) may have a pinched base resistance of Rdb=2,000–3,000 ohms/sq. while a digital transistor may have an Rdb=10,000 ohms/sq. or greater.

Such divergent values of transistor parameters have been very difficult and complicated if not impossible to obtain on a single chip. For example, in group III–V semiconductor compounds such as GaAs and AlGaAs, solutions such as completing one transistor, etching off all the films including emitter, base and any passivating layers, if required, in selected areas and forming a different transistor have been suggested. However, proposed processes are not BICMOS or silicon compatible. It is difficult to re-grow new layers in either group III–V transistors or silicon after reactive ion etching the surface, as was done in the prior art, because of the poor surface quality after etching. Additionally, the total thickness of the layers grown is quite different causing difficulty in removal of the films and planarization for further high-resolution lithography.

Further, it is not possible to share the thermal budget for high performance HBTs which are very differently optimized since optimization generally requires critical adjustment or design realization of the dopant profile within the respective transistors as well as optimization of base dimensions. Seeking to obtain different dopant profiles in transistors on the same chip has resulted in compromises that degrade performance and yield of one or more of the transistor types since independence of transistor design was not possible. For example, known processes may have required identical emitter depths, resulting in non-optimal capacitance, linearity and/or current gain, which are critical for analog and microwave applications.

SUMMARY OF THE INVENTION

It is therefore an object of the present invention to provide a technique of providing completely independent optimization of bipolar transistors formed on the same chip.

It is another object of the present invention to provide a technique and structure for formation of bipolar transistors of potentially radically different electrical properties on the same chip with BICMOS circuits and compatible with silicon technologies.

In order to accomplish these and other objects of the invention, an integrated circuit and method for making the same is provided comprising the steps of protecting a silicon substrate with a protective layer selectively etchable to silicon, opening the protective layer at selected locations without etching the silicon substrate to form an opening, epitaxially growing a base layer over the opening in the protective layer, and repeating the steps of opening the protective layer and epitaxially growing a base layer at different locations and using materials having different material concentration profiles.

In accordance with another aspect of the invention, an integrated circuit device is provided having silicon collector regions and at least first and second transistors formed in combination with respective silicon collector regions, the transistors differing from each other by base width, size or material concentration profile.

In accordance with a further aspect of the invention, a method of forming transistors of different designs on a single chip is provided including steps of forming a first protective layer on a substrate including collector regions of respective transistors, forming a second protective layer on the first protective layer wherein the second protective layer and the first protective layer are selectively etchable with respect to each other, patterning the second protective layer and the first protective layer to a collector region, forming a first base layer, patterning the first base layer and the second protective layer to the first protective layer with a hard mask, forming a further second protective layer, patterning the further second protective layer and the first protective layer to another collector region, forming a second base layer, patterning the second base layer and the further second protective base layer to the first protective layer, and completing transistors including the first base layer and the second base layer, respectively.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
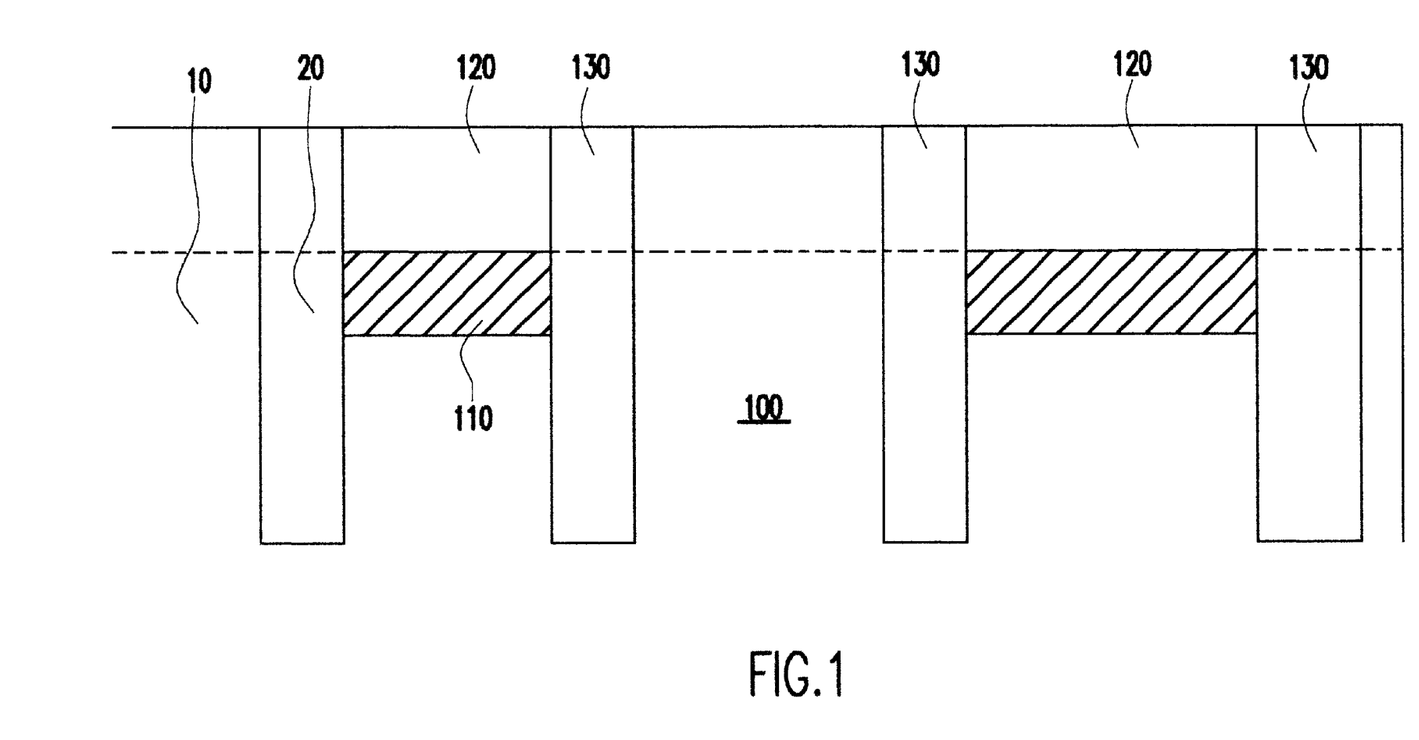
FIGS. 1, 2, 3, 4, 5, 6, 7, 8, 9 and 10 are cross-sectional view of stages in formation of bipolar transistors with independent base thicknesses/widths and different dopant profiles on the same silicon substrate.

Referring now to the drawings, and more particularly to FIG. 1, there is shown, in cross-sectional view, an early stage in production of transistors in a manner by which each can be independently optimized in accordance with the invention. It should be recognized that the technique of the invention as will be described below is fully compatible with most current CMOS processing and can be performed after most CMOS processing is complete, if CMOS devices and/or circuits are to be provided on the same chip. It may also be desirable to perform some steps in accordance with the invention prior to CMOS device formation in order to improve CMOS performance (or further reduce CMOS power dissipation) in addition to optimizing both types of bipolar transistors as will be discussed below.

Therefore, it is not necessary to describe CMOS processing in detail since such details are not important to the practice of the invention and will be familiar to those skilled in the art. The inclusion of CMOS transistor circuitry is depicted by impurity well 10 in FIGS. 1 and 2, separated from bipolar transistor devices formed in accordance with the invention by, for example, deep trench isolation structure 20.

Figure 2:
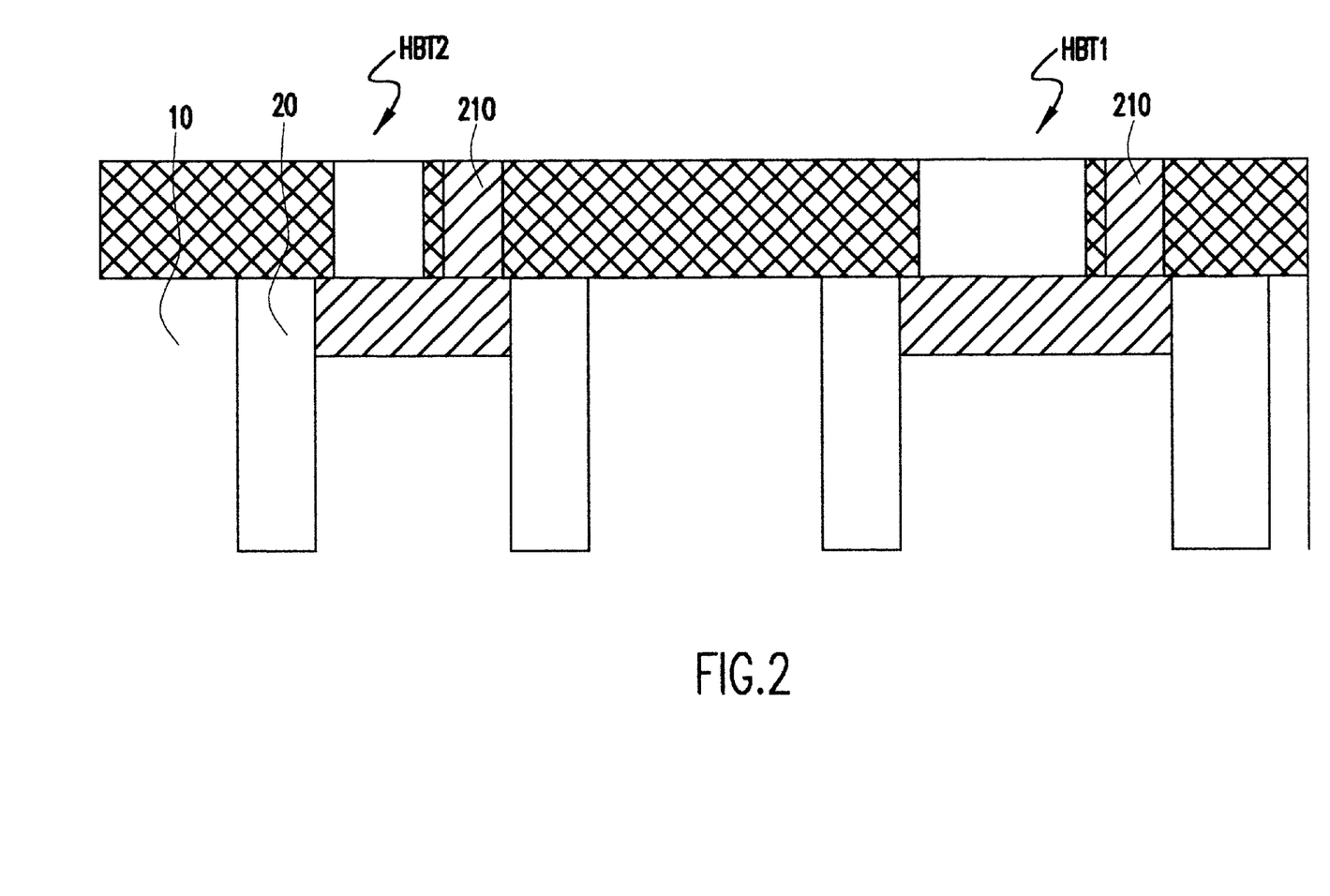
Figure 3:
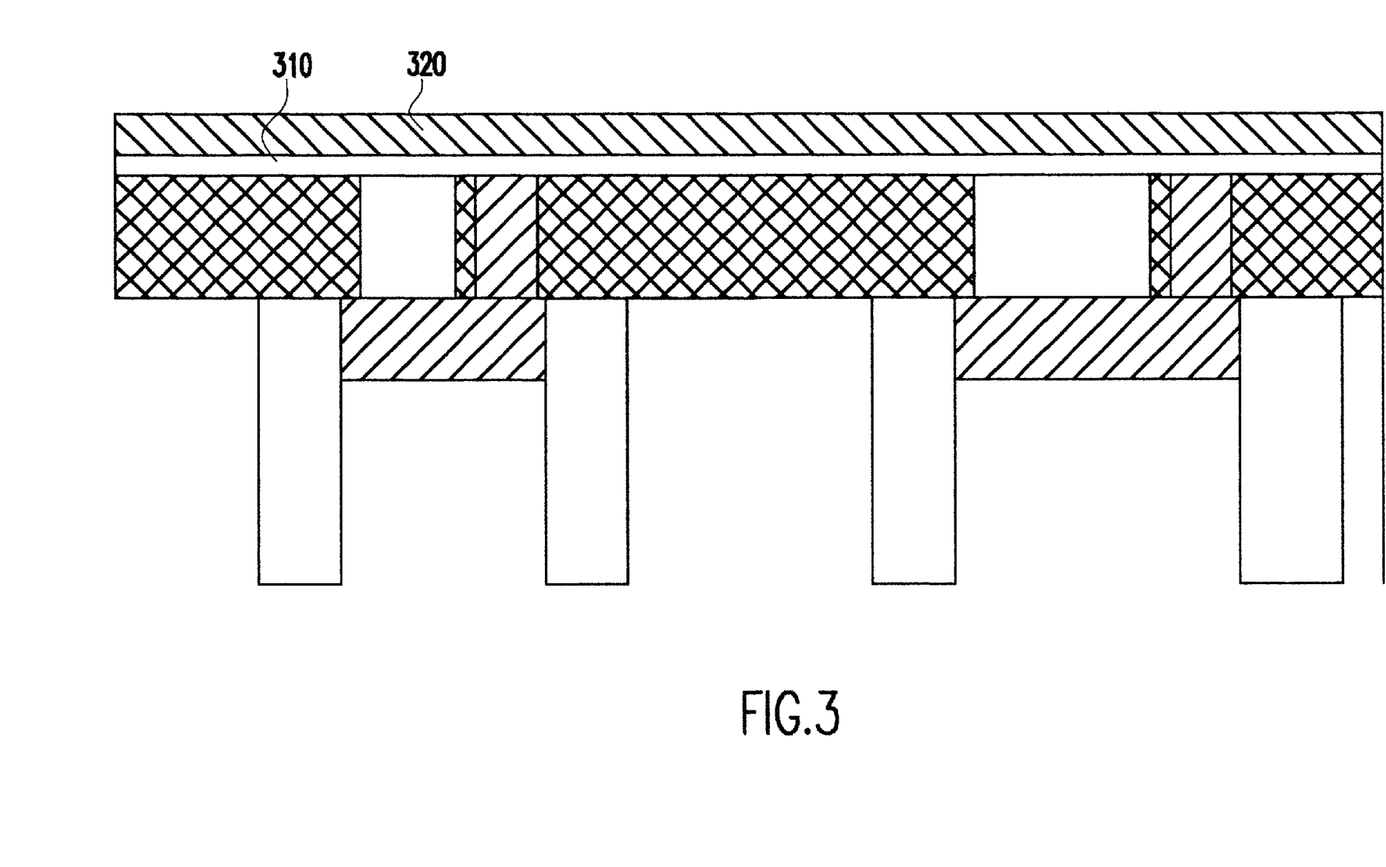

FIG. 1 shows a silicon substrate 100 with a subcollector 110, an epitaxially grown collector region 120 and deep trench isolation structures 130 formed by techniques familiar to those skilled in the art. Then, as shown in FIG. 2, reach through collector contacts are formed to the subcollector regions 110 in a known manner not-critical to the practice of the invention. At this point, the structures where HBT1 and HBT2 will be formed remain identical. It is considered preferable to form CMOS structures at this point in the process by, for example, forming CMOS wells (e.g. 10), forming a gate oxide, applying a polysilicon gate layer, patterning the polysilicon gate layer to form individual transistor gates and performing source and drain implants and extension implants and corresponding anneals, possibly in connection with the formation of gate sidewalls to do so in a self-aligned, sub-lithographic manner.

The CMOS regions can then be masked and block-out masks and collector implants sequentially performed for the HBT1 and HBT2 regions. It should be recognized that the collector implants may be independently performed with different impurities (e.g. for NPN and PNP transistors) and different energies to accommodate any transistor design optimization. It should also be appreciated that the invention is not limited to two bipolar transistor designs with respect to which the principles of the invention will be discussed for simplicity and clarity but can be extended to any number of differently optimized bipolar transistor designs on a single chip.

Figure 4:
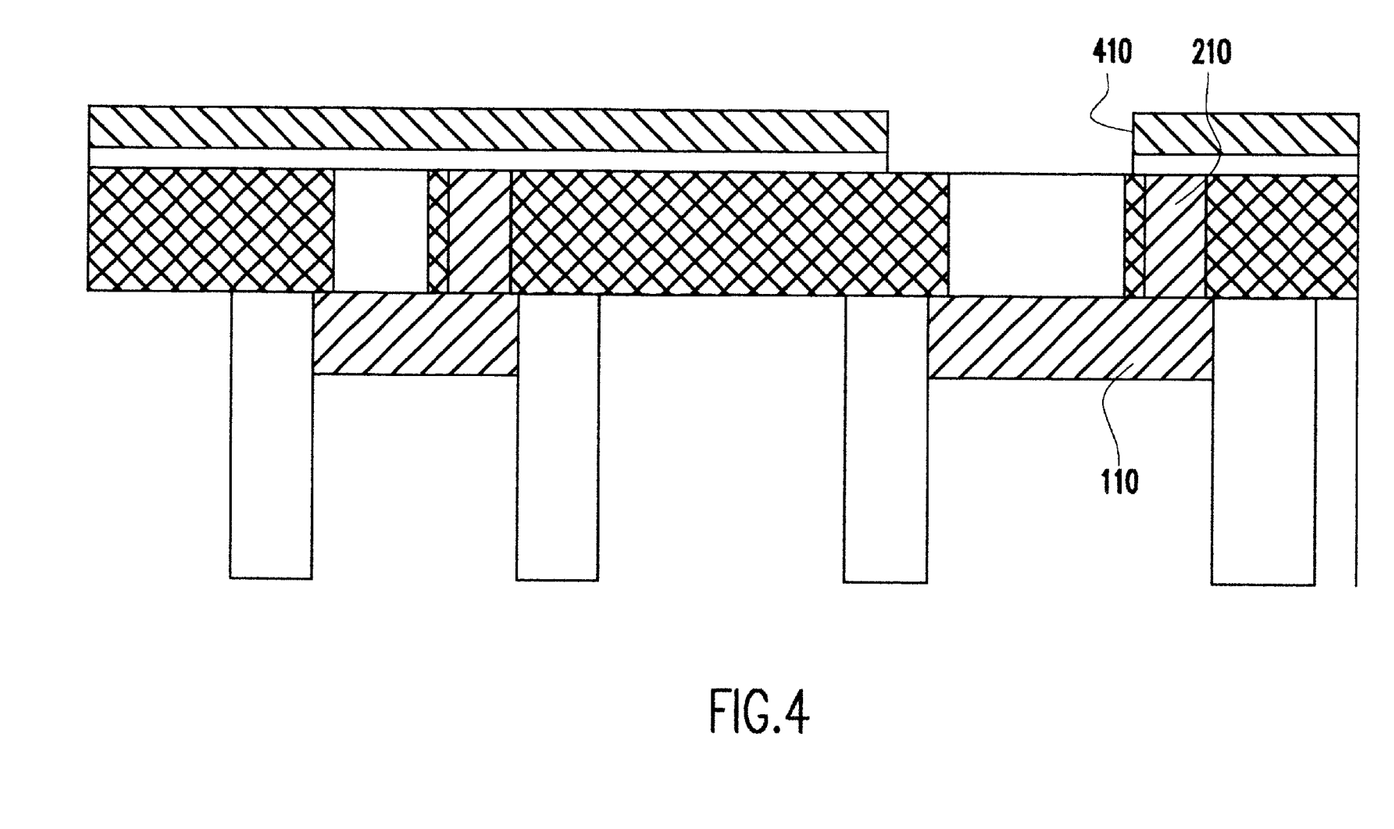

Following as many collector implants as may be necessitated by the number of differently optimized transistor designs to be included on the chip (or at least the number of designs requiring different collector implants), the entire surface is covered with a thin protective oxide deposited layer 310 (preferably of 10–50 nm thickness) and a protective silicon layer 320 ( preferably of 10–100 nm thickness). These layers protect the CMOS region of the chip and the active areas remaining to be processed. The oxide layer 310 serves as an etch stop in later patterning processes as will be discussed below. Then a resist is applied and patterned and the protective layers are etched by a combination of wet and dry etching to open the active area 410 of HBT1, as shown in FIG. 4. It is desirable that these openings 410 be somewhat larger than the collector to simultaneously form both the extrinsic and intrinsic base regions of the transistor but positioned such that the reach through contact 210 to subcollector 110 remains protected.

Figure 5:
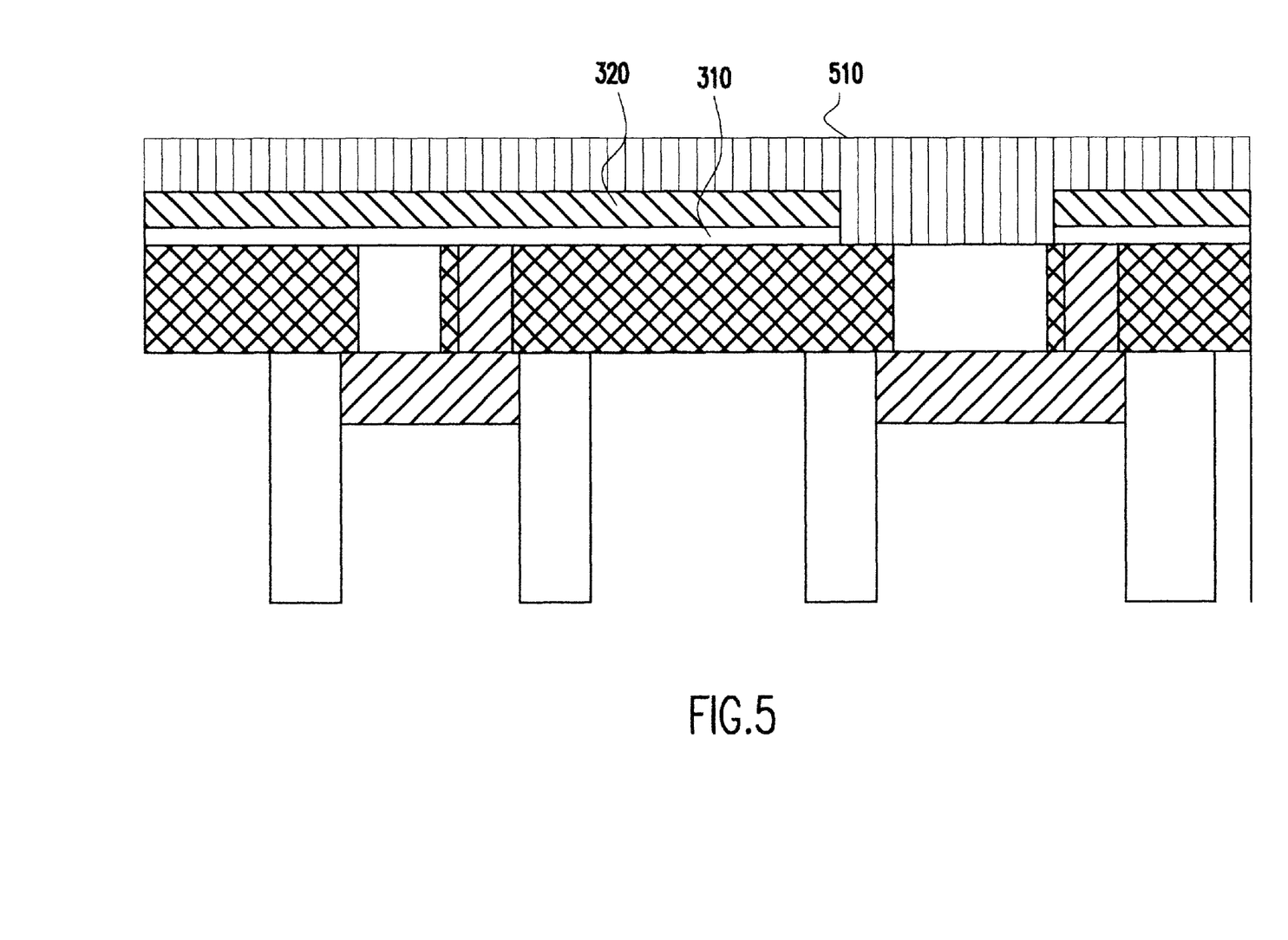
Figure 6:
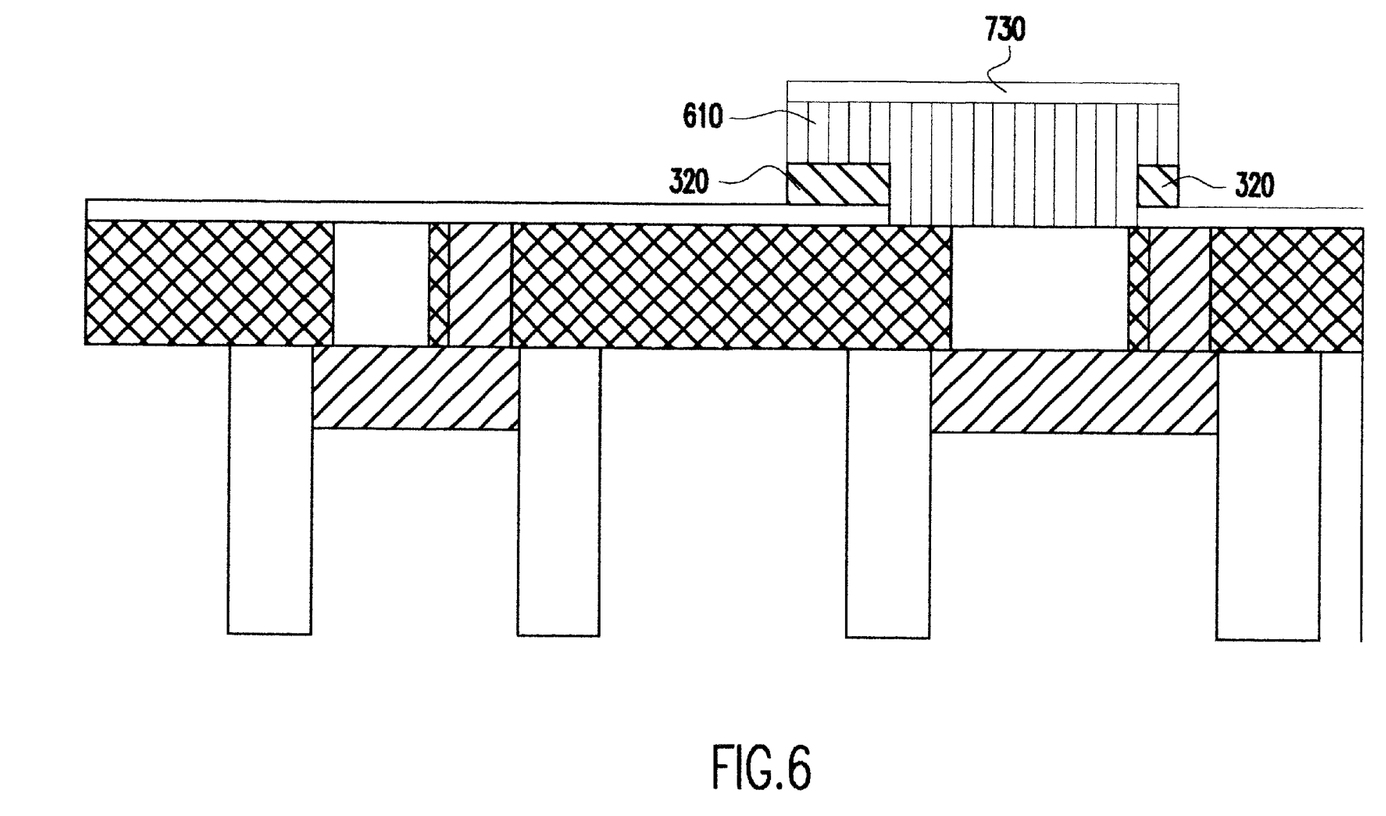

Then, as shown in FIG. 5, an epitaxial base layer 510 is deposited/epitaxially grown using a technique such as ultrahigh vacuum vapor deposition (UHV-CVD) to any desired thickness greater than the protective layers 310, 320. This layer may contain germanium, boron, carbon or any combination of these elements in any desired concentration profile across the base thickness/width to provide a desired energy band structure and doping for the first type of heterojunction bipolar transistor (HBT) for optimum performance. Since the protective layers may be made quite thin, wide design latitude in gate dimensions is provided. Using patterned resist, the base layer 510 and protective layer 320 are etched to oxide etch stop layer 310, as shown in FIG. 6, using standard etch chemistries well-known to those skilled in the art in accordance with desired extrinsic base dimensions 610. Layer 730 is the hard mask layer for etching the base of HBT1; the formation and use of which will be familiar to those skilled in the art. Any portion of the polysilicon protective layer 320 which is not removed in accordance with the hard mask layer 730 becomes part of the extrinsic base of the transistor HBT1.

Figure 7:
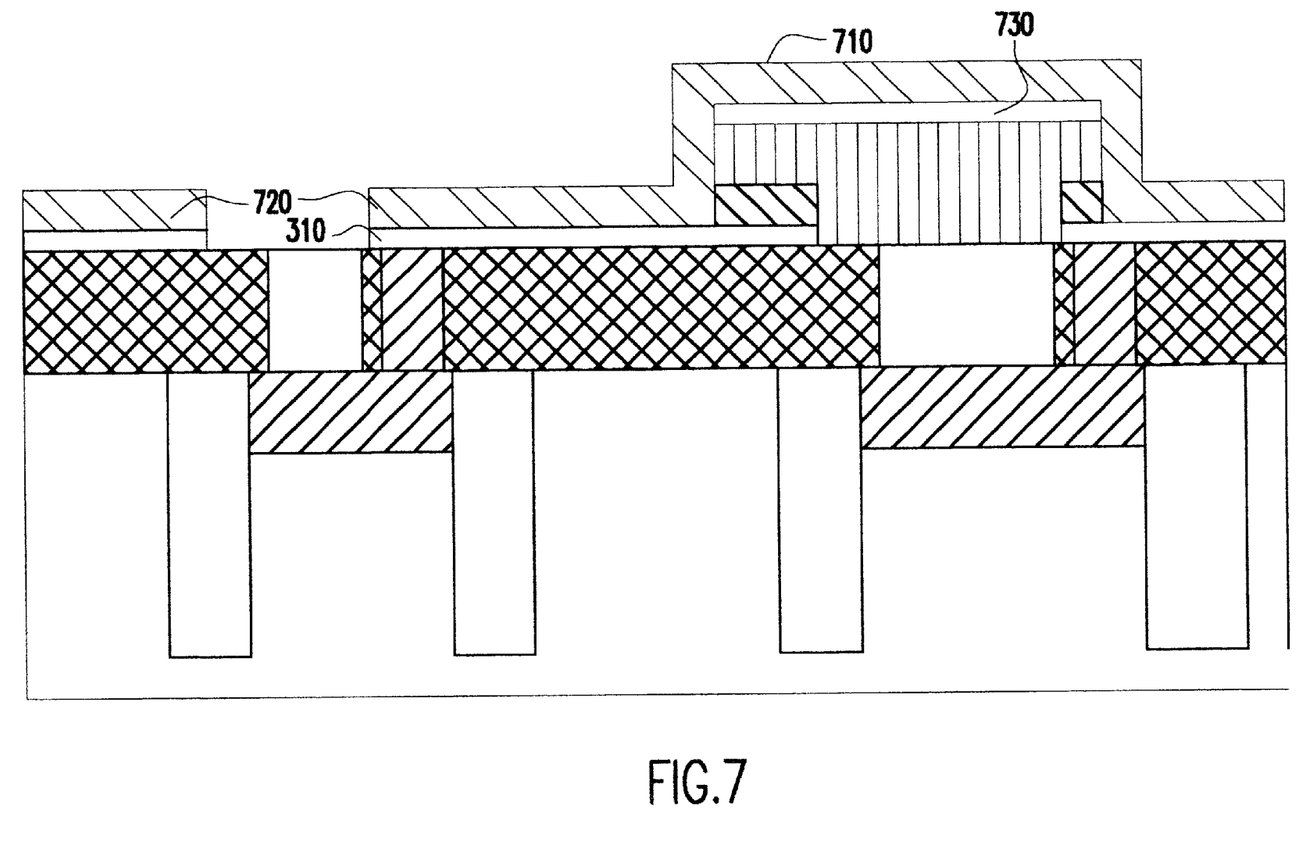

As shown in FIG. 7, a second polysilicon protective layer is grown over protective etch stop 310 which will exist everywhere on the chip except where HBT1 has already been formed. This feature of the invention is key to extending the invention to three or more bipolar transistor designs since, after formation and patterning of the extrinsic base of any given transistor design, the entire remaining surface where other designs are to be formed remains covered with oxide 310. Therefore, covering the oxide 310 with another polysilicon protective layer 710 which can be selectively opened at the sites of the active area(s) of the next transistor type to be formed allows as many types of independently optimized designs to be formed without separately etching off layers that leaves a poor surface for further silicon epitaxial growth. Then, the opened polysilicon protective area can be used as a hard mask to open the oxide by an etch selective to silicon, preferably by a wet, dilute HF etch. This process can be repeated at will to accommodate as many different transistor designs as desired.

Figure 8:
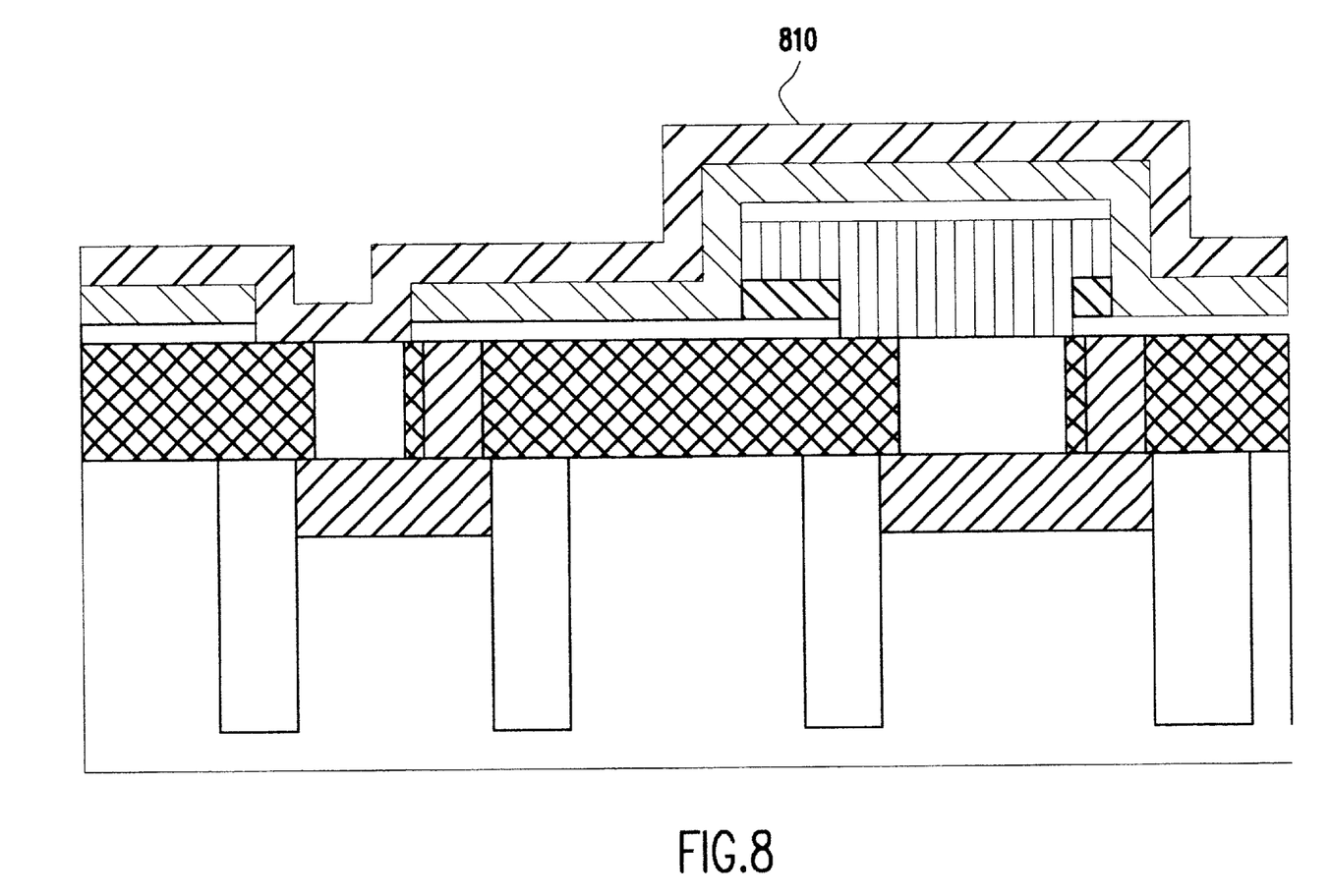
Figure 9:
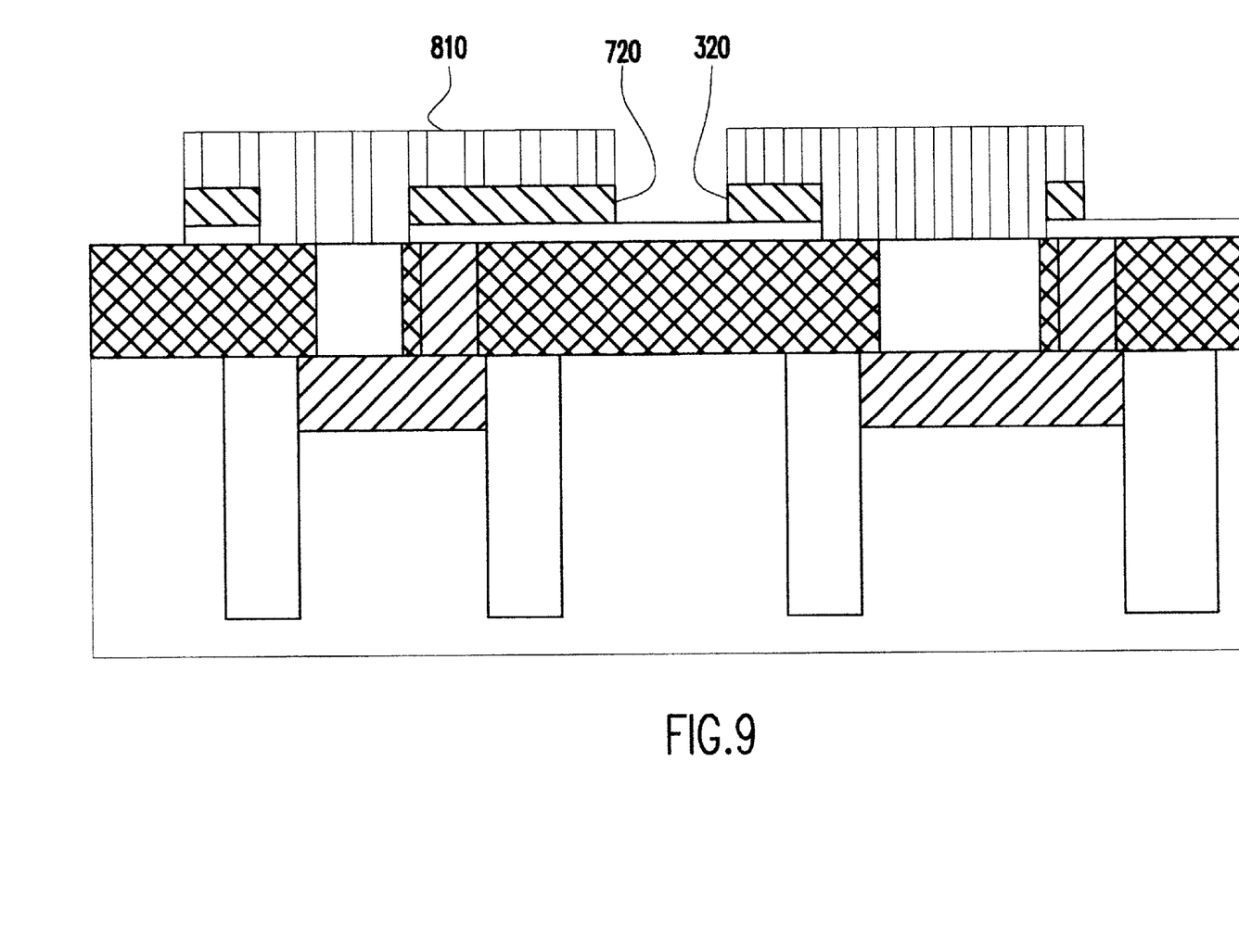
Figure 10:
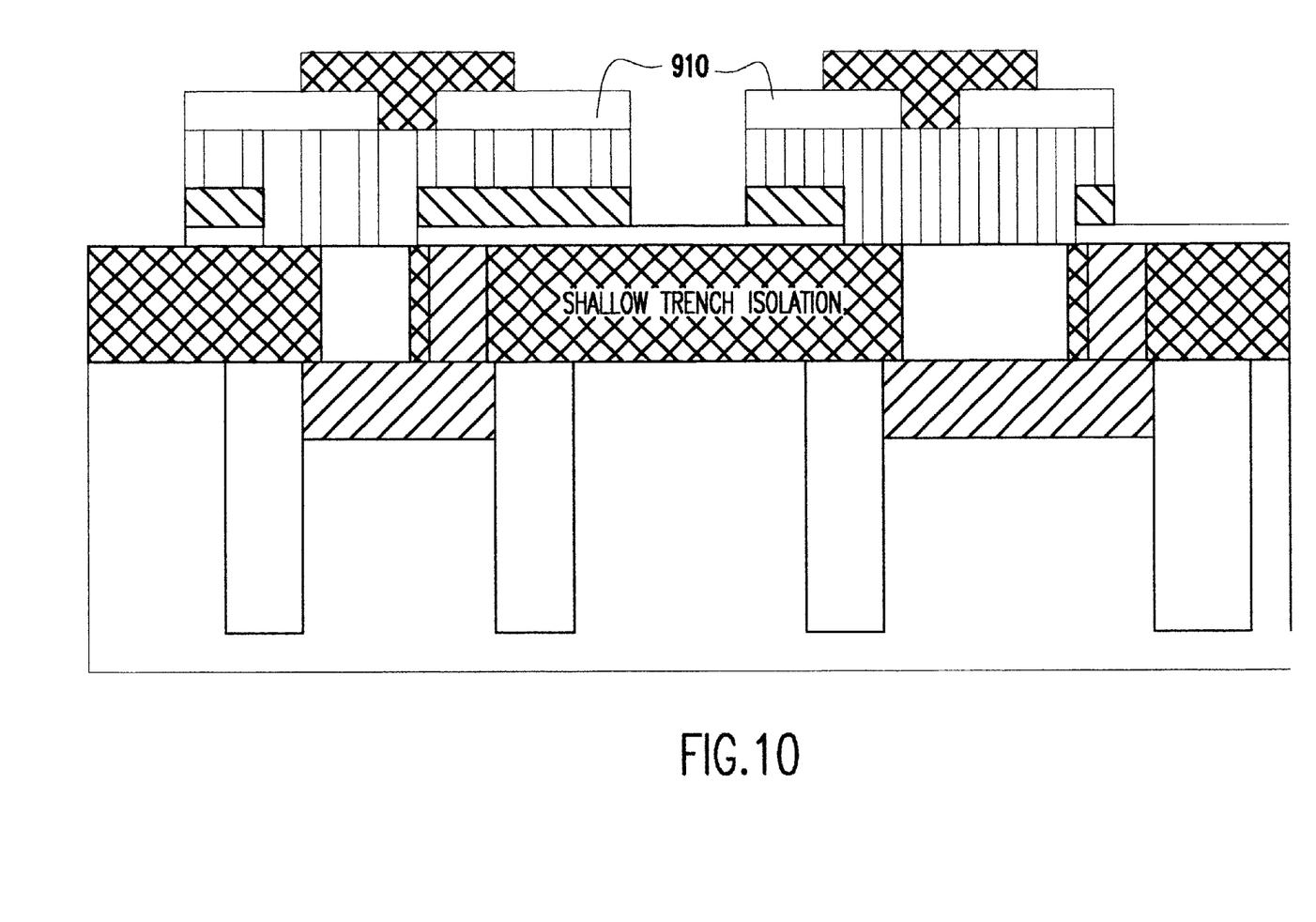

Following opening of the protective layer 710 at 720, an epitaxial layer 810 for HBT2 is deposited/grown, again, to any desired thickness greater than the thickness of protective layers 310, 710 as shown in FIG. 8. Masked etching is used to define/pattern the base layer in accordance with the desired extrinsic base pattern. As before, portions of polysilicon protective layer 710 which are not etched away become part of the extrinsic base of transistor HBT2. No polish or planarization is required at this stage. Deposition of the base layers can be in any sequence and an additional thermal anneal can be performed between depositions if required to adjust dopant profile of previously deposited base layers independently of subsequently deposited base layers.

Appropriate processes include ultra-high vacuum chemical vapor deposition, or rapid thermal vapor deposition at temperatures of 450°–850° at rates of 0.2–200 nm/min. to a thickness of 50–300 nm., which is also possibly appropriate for the above base layer deposition process for HBT1. The composition of material and impurity concentration can be freely manipulated during this deposition process (for either or both of HBT1 and/or HBT2) to obtain any desired impurity profile. The thickness of layer 810 can be freely chosen and portions thereof can be made to correspond to either or both of the collector and/or emitter to further reduce base width or thickness, if desired or required by a particular transistor design optimization. The base of HBT2 can be patterned to the desired outline of the extrinsic base, as before, using standard chemistries, as shown in FIG. 8. Again, oxide 310 and 730 are used as etch stops. This process can be repeated with variations for other transistor designs to be formed on the same chip.

Once the bases of all transistor designs have been deposited and patterned to provide a roughly planar surface, base and collector implants can be performed for each transistor design using block-out masking and controlled, in part, by oxide on the base layers such as 730. The oxide layer is then removed. At this point, the emitter structure, as desired can be formed for each transistor design such as by forming an emitter stack and temporary mandrel, emitter patterning and etch, sidewall spacer formation and extrinsic base implant and anneal, mandrel removal, forming the emitter opening and deposit of emitter polysilicon, as will be well-understood by those skilled in the art and results in a self-aligned emitter-base junction. A passivating film such as oxide or nitride can then be applied.

At this point, block-out masks and different emitter implants can be done for the respective HBT designs (e.g. HBT1, HBT2), such as arsenic and phosphorus, respectively, to a dose of, for example $1 \times 10^{15}/cm^2$ to $5 \times 10^{16}/cm^2$ at 20–100 KeV. The transistor is then completed by conventional steps including an emitter implant activation anneal at, for example, 850° to 1100° C. for 1–20 seconds.

It should be noted that the emitter impurity activation anneal is the highest temperature process described in the process steps in accordance with the invention and that all high temperature process steps described above are performed only for relatively short intervals. Therefore there is a very low likelihood that any CMOS transistor structures or parameters would be affected. At the same time, the base anneals and emitter anneals are performed concurrently and within the heat budget of any transistor design type since use of differing base insulator (e.g. 710) thickness can be used to tailor the implants independently so that design impurity profiles for different types of bipolar transistors optimized for different purposes can be achieved with complete independence and without exceeding the heat budget of any design.

Collector doping and thickness of the two types of HBTs can be made different because of the masked collector implants (which can be of different doses and energies) as well as oxide layer 730. In addition, a part of the collector can be deposited as part of the base deposition as alluded to above and could be doped n-type by implantation or during growth or by a combination thereof.

Base thickness and doping, as well as composition can be varied to develop any desired energy band profile by separate low temperature growth processes. The low temperature is important for layer stability to prevent dislocation due to strain as well as to keep the sharp, as-deposited boron profile.

Emitter size can be independently varied by lithographic definition. Emitter depth and penetration into the base is controlled, as alluded to above, by growing a thin silicon layer as the last part of the base deposition and which can be different for different transistor design types/impurity profiles. The doping can also be independently controlled by doping this silicon layer with phosphorus during the deposition. Emitter contact and interface control is achieved by polysilicon deposition and arsenic or phosphorus implants of different doses and/or energies. Thus it is seen that the collector, base and emitter thickness, size and dopant concentration can be made independent in accordance with the invention and providing nine degrees of freedom for complete and independent optimization of transistors of differing design on the same chip.

In view of the foregoing, it is evident that the invention provides a technique for providing complete independence of base dimensions and impurity profiles in the collector, base and emitter to accommodate any number of transistor designs on a single chip, potentially together with CMOS. Therefore, the invention provides for silicon and BICMOS compatible formation on a single chip of transistors which may be respectively optimized for extremely high performance of diverse functions. Therefore, the invention allows system-on-a-chip fabrication even where performance demands are particularly critical.

While the invention has been described in terms of a single preferred embodiment, those skilled in the art will recognize that the invention can be practiced with modification within the spirit and scope of the appended claims.

We claim:

1. A method of forming transistors of different designs on a single chip, said method including steps of forming a first protective layer on a substrate including collector regions of respective transistors, forming a second protective layer on said first protective layer, said second protective layer and said first protective layer being selectively etchable with respect to each other, patterning said second protective layer and said first protective layer to a collector region, forming a first base layer, patterning said first base layer and said second protective layer to said first protective layer with a hard mask, forming a further second protective layer, patterning said further second protective layer and said first protective layer to another collector region, forming a second base layer, patterning said second base layer and said further second protective base layer to said first protective layer, and completing transistors including said first base layer and said second base layer, respectively.

2. A method as recited in claim 1, wherein one of said steps of forming said first base layer and said second base layer includes deposition of collector material on said collector region.

3. A method as recited in claim 1, wherein one of said steps of forming said first base layer and said second base layer includes deposition of a thin silicon layer over base material.

4. A method as recited in claim 1, wherein said thin silicon layer contains phosphorus.

5. A method as recited in claim 1, wherein a collector implant is controlled, in part, by a thickness of said hard mask.

6. A method as recited in claim 1, wherein said step of completing said transistors includes lithographic patterning of emitters of respective transistors.

7. A method as recited in claim 1, wherein said first protective layer is an oxide.

8. A method as recited in claim 7, wherein said second protective layer is polysilicon.

9. A method as recited in claim 8, wherein said further second protective layer is polysilicon.

10. A method as recited in claim 1, wherein said second protective layer is polysilicon.

11. A method as recited in claim 1, wherein said further second protective layer is polysilicon.

12. A method as recited in claim 1, wherein said steps of forming said first and second base layers are performed by low temperature growth processes.

13. A method as recited in claim 1, further including an annealing process prior to forming said step of forming said second base layer.

14. A method as recited in claim 1, further including the step of
removing said hard mask.

15. A method as recited in claim 1, wherein one of said first and second base layers contains germanium, boron and/or carbon.

* * * * *